(12) United States Patent
Köelbli

(10) Patent No.: US 9,188,613 B2
(45) Date of Patent: Nov. 17, 2015

(54) ELECTRONIC CIRCUIT AND METHOD FOR DETERMINING AN IMPEDANCE

(75) Inventor: Bertram Köelbli, Frankfurt (DE)

(73) Assignee: Junghans Microtec GmbH, Dunningen-Seedorf (DE)

( * ) Notice: Subject to any disclaimer, the term of this patent is extended or adjusted under 35 U.S.C. 154(b) by 667 days.

(21) Appl. No.: 13/561,534

(22) Filed: Jul. 30, 2012

(65) Prior Publication Data
US 2012/0286807 A1   Nov. 15, 2012

Related U.S. Application Data

(63) Continuation of application No. PCT/EP2011/000352, filed on Jan. 27, 2011.

(30) Foreign Application Priority Data

Jan. 28, 2010   (DE) .......................... 10 2010 006 230

(51) Int. Cl.
| | | |
|---|---|---|
| *G01R 27/28* | (2006.01) | |
| *G01R 27/02* | (2006.01) | |
| *G01V 3/10* | (2006.01) | |
| *G01R 25/00* | (2006.01) | |
| *H02H 3/38* | (2006.01) | |
| *G11C 16/10* | (2006.01) | |
| *G01R 29/02* | (2006.01) | |

(52) U.S. Cl.
CPC ................ *G01R 27/02* (2013.01); *G01R 25/00* (2013.01); *G01R 27/28* (2013.01); *G01V 3/101* (2013.01); *G11C 16/102* (2013.01); *H02H 3/382* (2013.01); *G01R 29/023* (2013.01)

(58) Field of Classification Search
CPC ........ G01R 27/02; G01R 27/28; G01R 25/00; G11C 16/102; G01V 3/101; H02H 3/382
USPC ......... 324/655, 654, 649, 600, 525, 521, 650, 324/683, 709, 691, 76.52, 76.39, 708, 324/76.51, 652, 682
See application file for complete search history.

(56) References Cited

U.S. PATENT DOCUMENTS

| | | | | |
|---|---|---|---|---|
| 5,077,547 | A * | 12/1991 | Burgmann .................... | 340/501 |
| 5,113,766 | A * | 5/1992 | Grosch .......................... | 102/427 |
| 5,132,687 | A * | 7/1992 | Baldwin et al. ................. | 342/44 |

(Continued)

FOREIGN PATENT DOCUMENTS

DE   3637093 C1   5/1996

OTHER PUBLICATIONS

International Search Report of PCT/EP2011/000352.

*Primary Examiner* — Hoai-An D Nguyen
(74) *Attorney, Agent, or Firm* — Laurence A. Greenberg; Werner H. Stemer; Ralph E. Locher

(57) ABSTRACT

An electronic circuit is arranged in an external programming device and is used for contactless programming of a circuit to be programmed. The electronic circuit has a series resonant circuit that includes a transmitter coil and a capacitor. The transmitter coil of the series resonant circuit is used for inductive coupling to a receiver coil in the circuit to be programmed. For the purpose of evaluating the impedance that actually exists in the circuit to be programmed, there is provided a device for determining the value of the impedance from a phase difference between the control voltage of the series resonant circuit and the capacitor voltage of the series resonant circuit.

20 Claims, 5 Drawing Sheets

(56) References Cited

U.S. PATENT DOCUMENTS 6,904,315 B2 * 6/2005 Panken et al. .................... 607/9
2009/0140785 A1 6/2009 Choi
2009/0295548 A1 * 12/2009 Ronkka et al. ............. 340/10.51
2010/0217553 A1 * 8/2010 Von Novak et al. ............ 702/65

* cited by examiner

ELECTRONIC CIRCUIT AND METHOD FOR DETERMINING AN IMPEDANCE

CROSS-REFERENCE TO RELATED APPLICATION

This application is a continuation, under 35 U.S.C. §120, of copending international application PCT/EP2011/000352, filed Jan. 27, 2011, which designated the United States; this application also claims the priority, under 35 U.S.C. §119, of German patent application DE 10 2010 006 230.8, filed Jan. 28, 2010; the prior applications are herewith incorporated by reference in their entirety.

BACKGROUND OF THE INVENTION

Field of the Invention

The present invention relates to an electronic circuit, which is arranged in an external programming device and is used for contactless programming of a circuit to be programmed. The electronic circuit contains a series resonant circuit that comprises a transmitter coil and a capacitor, wherein the transmitter coil of the series resonant circuit is used for inductive coupling to a receiver coil arranged in the circuit to be programmed. The invention also relates to a method for determining the impedance that actually exists in a programmable circuit, which can be programmed in a contactless manner by the electronic circuit described above.

The above-mentioned electronic circuit of an external programming device is often used to program a circuit by modulating a carrier frequency. This process involves transmitting data, for example, that defines a time, at the end of which time the circuit to be programmed outputs a signal that causes a predefined action. The coupling between the electronic circuit arranged in the external programming device and the circuit to be programmed, which often comprises a microprocessor, is usually effected via an inductive interface. The data is transmitted via the inductive interface using a transmitter coil arranged in the electronic circuit of the external programming device to a receiver coil arranged in the circuit to be programmed, or vice versa, wherein a coupling factor k must be taken into account between the transmitter coil and the receiver coil. Programming by means of the modulated carrier-frequency process is preferably performed digitally.

During the programming process, the circuit to be programmed returns a feedback signal to the programming device to acknowledge the programming. For this purpose, when the electronic circuit is in the on state, the circuit to be programmed is closed, for instance by way of a semiconductor switch, and operated at a feedback frequency. The binary information that is fed back can be encoded in a different number of pulse packets that are emitted at a defined bit rate. Thus a binary zero can be represented, for instance, by four short-circuit cycles of the feedback frequency, and a binary one, for instance, by eight short-circuit cycles of the feedback frequency. This form of inductive transmission and feedback is presented, for example, in the standards STANAG 4369 or STANAG 4547.

One of the factors that are important for correct transmission and for correct reception of feedback information is the range in which the series impedance of the circuit to be programmed lies during the feedback phase. Here, the parasitic series impedance comprises the sum of the resistances of all connecting elements between the receiver coil and the other elements of the circuit to be programmed, the inherent ohmic series resistance of the receiver coil and all the resistances of the other elements of the circuit to be programmed. The value of this impedance is subject to variations caused by environmental influences or the manufacturing process of the circuit to be programmed or of the product fitted with this circuit. In order to be able to guarantee a constant connection quality for a receiver coil of the circuit to be programmed and that is integrated in a product, it is desirable to be able to obtain in a contactless manner the value of this impedance during each feedback process.

According to the prior art, it is not possible to measure the specific impedance value; it is only possible to state whether or not the feedback is working. This means that according to the prior art, it is only possible to detect an open-circuit in the circuit to be programmed or faulty electronics in the circuit to be programmed. Critical variations in the impedance within the working range of the feedback, such as those that occur as a result of environmental stress, for instance, cannot be detected by the prior art circuits used hitherto.

SUMMARY OF THE INVENTION

It is accordingly an object of the invention to provide an electronic circuit and a method for determining an impedance which overcome the above-mentioned disadvantages and shortcomings of the heretofore-known devices and methods of this general type and which provides for an electronic circuit and a method that enable contactless evaluation of the impedance that actually exists in a circuit to be programmed.

With the foregoing and other objects in view there is provided, in accordance with the invention, an electronic circuit in an external programming device and configured for contactless programming of a circuit to be programmed, the electronic circuit comprising:

a series resonant circuit including a transmitter coil and a capacitor connected in series;

the transmitter coil of the series resonant circuit being disposed for inductive coupling to a receiver coil of the circuit to be programmed; and a device connected to the series resonant circuit and configured for determining, from a phase difference between a control voltage of the series resonant circuit and a capacitor voltage of the series resonant circuit, an actual impedance existing in the circuit to be programmed.

In other words, the objects of the invention are achieved by an electronic circuit in which means are provided for determining, from a phase difference between the control voltage of the series resonant circuit and the capacitor voltage of the series resonant circuit, the actual impedance that exists in the circuit to be programmed.

The present invention makes use of the knowledge that the feedback of the circuit to be programmed causes a change in the phase difference between the control voltage of the series resonant circuit that lies across the transmitter coil and the capacitor voltage of the series resonant circuit. The series resonant circuit constitutes a second-order low-pass filter with regard to said two voltages, i.e. the series resonant circuit tuned to the carrier frequency of the programming circuit generates at resonance a phase difference of 90° between capacitor voltage and control voltage. A secondary, induced current flow through the receiver coil after closing the circuit to be programmed in feedback mode causes a virtual reduction in the primary inductance of the transmitter coil. This reduction also decreases the abovementioned phase difference, where the change is greater, the greater the current flowing on the secondary side and the larger the coupling factor k between transmitter coil and receiver coil.

For a fixed and reproducible coupling factor k, which can be achieved by suitable selection of the measurement environment (for example by a design that creates constant and reproducible geometrical ratios between transmitter coil and receiver coil), the impedance is evaluated from the phase difference. A small impedance results in a high secondary current and hence in a small overall phase difference, because the change in the phase difference is large in this case. Each increase in the impedance reduces the secondary current and thereby increases the phase difference back towards the value of 90°.

The detected phase difference can be analyzed particularly easily and in particular digitally when the means for determining the actual impedance comprises an equivalence element, to which the control voltage, pulsed at a carrier frequency, is applied to a first input, and to which the capacitor voltage of the series resonant circuit is applied to a second input, and comprises means for determining a duty factor at the output of the equivalence element. An equivalence element tests whether the same level or the same logic state is applied to the two inputs. In a preferred exemplary embodiment, a digital equivalence element is used, for example an EXOR gate (also known as an XOR gate) or an EXNOR gate (also known as an XNOR gate). As an alternative to the digital equivalence elements mentioned, this can also be implemented by means of other logic gates (AND, OR, NAND etc.). As a further alternative, the equivalence element can also be realized as an analog circuit, for example using comparators.

The terms duty factor and mark-space ratio refer quite generally to the ratio of the length of the on state (pulse width) to the period length. They are also known as a pulse duty cycle, pulse control factor, or a duty cycle.

In a further preferred exemplary embodiment, the capacitor voltage is fed to the second input of the equivalence element via a level converter. The level converter ensures that the capacitor voltage is applied to the equivalence element in the correct voltage range.

The digital analysis and determination of the duty factor, and thereby the measurement of the actual impedance that exists in the circuit to be programmed, is achieved by providing a preferably binary up/down counter as the means for determining the duty factor (mark-space ratio), the up/down input of which is connected to the output of the equivalence element, and said up/down counter is clocked by a counting clock that equals a multiple of the carrier frequency, preferably $2^{n-1}$ times the carrier frequency, and preferably has an n-bit wide output.

In a further preferred exemplary embodiment, the carrier frequency is generated by a frequency generator and a frequency divider which is connected to the output of said frequency generator and preferably has a divider factor of $2^{n-1}$. This manner of generating the carrier frequency is advantageous because thereby in the electronic circuit not only is the carrier frequency available at the output of the frequency divider but also a far higher frequency generated by the generator. This can be used, for instance, as the counting clock of the up/down counter.

In order to be able to analyze the data of the actual impedance that exists in the circuit to be programmed, a latch is also provided in the electronic circuit in one exemplary embodiment, wherein the output of the up/down counter is connected to the input of the latch, and the input of the latch that triggers the data transfer is connected to the first input of the equivalence element. In a further exemplary embodiment, the output of the latch is preferably connected to a microprocessor, which performs the analysis of the actual impedance that exists.

In a further development of the invention, in order to enable correct read-in and read-out of the measured impedance data, a delay element is also provided, which is arranged between the first input of the equivalence element and the reset input of the up/down counter, and is operated at the carrier frequency. If applicable, the output of the delay element is also connected to an input of the microprocessor, said input determining the validity of the data at the input port. The timing of the reset and validity of the data at the input port is controlled by the delay element.

With the above and other objects in view there is also provided, in accordance with the invention, a method of determining an impedance that actually exists in a programmable circuit, wherein the programmable circuit includes a receiver coil for contactless coupling with an electronic circuit containing a series resonant circuit and wherein the series resonant circuit includes a transmitter coil and a capacitor. The method which comprises:

inductively coupling the transmitter coil of the series resonant circuit to the receiver coil of the programmable circuit;

measuring a phase difference between a control voltage of the series resonant circuit and a capacitor voltage of the series resonant circuit; and determining from the phase difference the impedance that actually exists in the programmable circuit.

In other words, the above objects are also achieved by a method for determining the impedance that actually exists in a programmable circuit, in which the phase difference between the control voltage of the series resonant circuit and the capacitor voltage of the series resonant circuit is measured, and the impedance that exists in the programmable circuit is determined therefrom. The method according to the invention has the advantages stated above with regard to the electronic circuit according to the invention.

In order to determine the phase difference, the control voltage, pulsed at a carrier frequency, and the capacitor voltage of the series resonant circuit are logically combined in a particularly simple manner by an equivalence element described above (e.g. EXOR gate or EXNOR gate), wherein the duty factor of the signal at the output of the equivalence element is analyzed.

A binary analysis is preferably performed by determining the duty factor of the signal at the output of the equivalence element by means of a preferably binary up/down counter, wherein the signal at the output of the equivalence element is fed to an up/down input of the up/down counter, wherein the up/down counter is clocked by a counting clock that equals a multiple of the carrier frequency, preferably $2^{n-1}$ times the carrier frequency, and preferably has an n-bit wide output.

Other features which are considered as characteristic for the invention are set forth in the appended claims.

Although the invention is illustrated and described herein as embodied in a electronic circuit and method for determining impedance, it is nevertheless not intended to be limited to the details shown, since various modifications and structural changes may be made therein without departing from the spirit of the invention and within the scope and range of equivalents of the claims.

Further advantages, features and potential applications of the present invention also arise from the following description of an exemplary embodiment of the electronic circuit according to the invention or of the method according to the invention and from the drawings. All features that appear in the description and/or are represented in the drawings, whether individually or in any combination, form the subject matter of the present invention, irrespective of how they are grouped in the claims or in the dependency references of the claims.

DETAILED DESCRIPTION OF THE INVENTION

Figure 1:
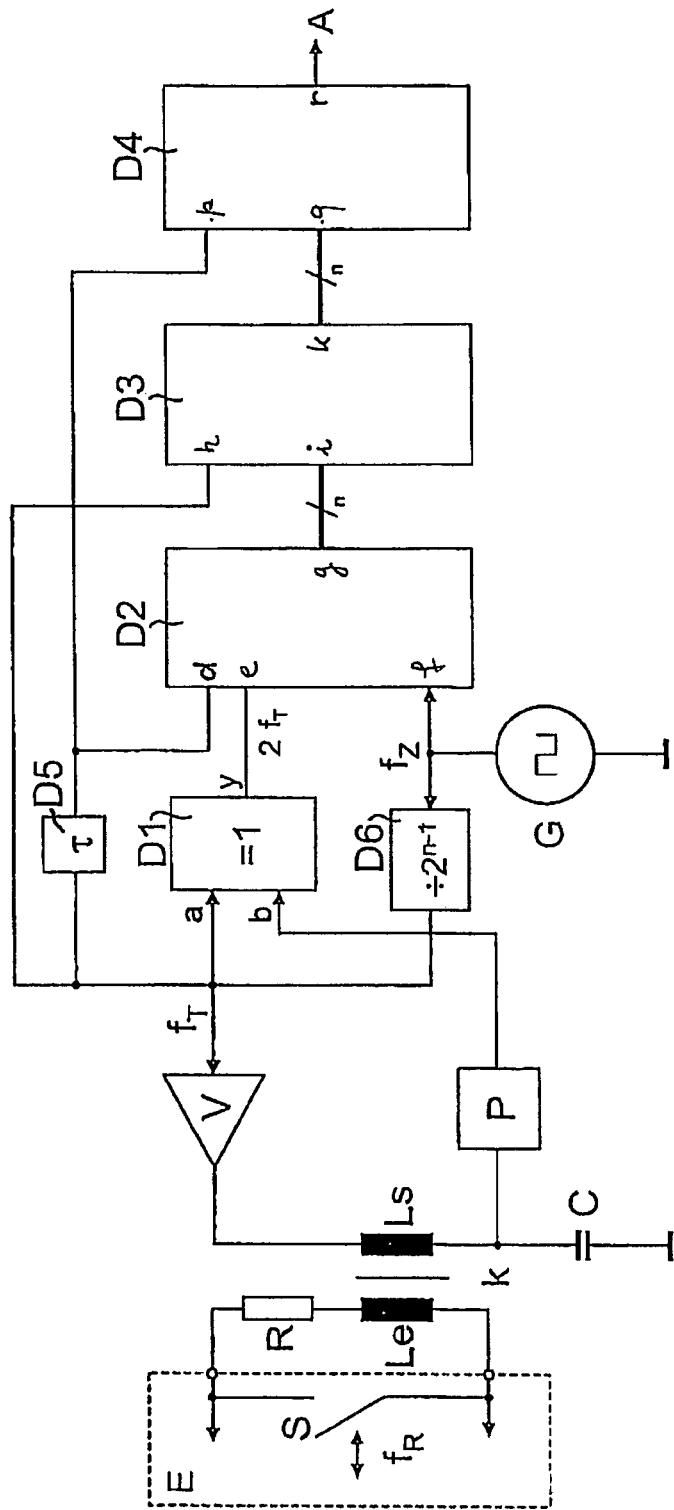
FIG. 1 is a schematic diagram of an electronic circuit for determining, according to the present invention, an actual impedance that exists in a circuit to be programmed.

Referring now to the figures of the drawing in detail and first, particularly, to FIG. 1 thereof, there is shown an electronic circuit according to the invention. The circuit includes a series resonant circuit that comprises a transmitter coil Ls and a capacitor C. The series resonant circuit is driven by a carrier frequency $f_T$, which is applied to the transmitter coil Ls via a power stage V. If an electronic circuit containing microprocessor E is intended to be programmed by way of the programming device in which the electronic circuit according to the invention is arranged, then this is done by inductive coupling to a receiver coil Le, which is connected to the microprocessor E. During the programming process, the circuit E returns a feedback signal to the programming device in order to acknowledge the programming. For this purpose, while the series resonant circuit of the programming device is in the ON state, the semiconductor switch S of the circuit E is operated at the feedback frequency $f_R$. The feedback frequency $f_R$ is less than the carrier frequency $f_T$ and equals 5 kHz for example. The fed-back information, which is preferably binary, can be encoded, for example, using a different number of pulse packets that are emitted at a defined bit rate. The parasitic series impedance that exists in the circuit to be programmed when the feedback signal is being emitted is represented in FIG. 1 by the single resistor R.

In the electronic circuit according to the invention, a generator G is also provided, which generates a high frequency $f_Z$, for example 25.6 MHz. This frequency $f_Z$ is applied to the input of a frequency divider D6 having a divider factor of $2^{n-1}$ and to the clock input for the counting clock of an up/down counter D2. The frequency divider D6 divides down the generator frequency $f_Z$ of 25.6 MHz, for example, by the relevant divider factor. For example, for n=8 and hence a divider factor of 128, the generator frequency of 25.6 MHz is reduced to 200 kHz. Hence the carrier frequency $f_T$ input to the power stage V equals 200 kHz, for example. The transmitter coil Ls is driven at this carrier frequency.

The control voltage of the electronic circuit according to the invention is also applied at the carrier frequency $f_T$ to the input a of the EXOR gate D1. The capacitor voltage, which is adjusted via a level converter P, is applied to the second input b of the EXOR gate D1. If the switch S of the circuit to be programmed is open and the series resonant circuit is tuned to the carrier frequency $f_T$, the output signal shown in FIG. 2a) is obtained at the output y of the EXOR gate D1, assuming, in addition, that both the power amplifier V and the level converter P do not introduce any additional phase differences. The signals D1 a and D1 b shown in FIGS. 2A and 2B in each case represent the signals applied to the respective input, and the signal denoted by D1 y in each figure represents the signal present at the output of the EXOR gate D1. As is evident from FIG. 2A, the signals at the inputs a and b of the EXOR gate have a phase difference of 90°. The output signal y of the EXOR gate is obtained from said inputs after the logical EXOR combination of the input signals and has a pulse rate of twice the carrier frequency $2 f_T$ and a duty factor of 0.5 or 50%.

Figure 2:
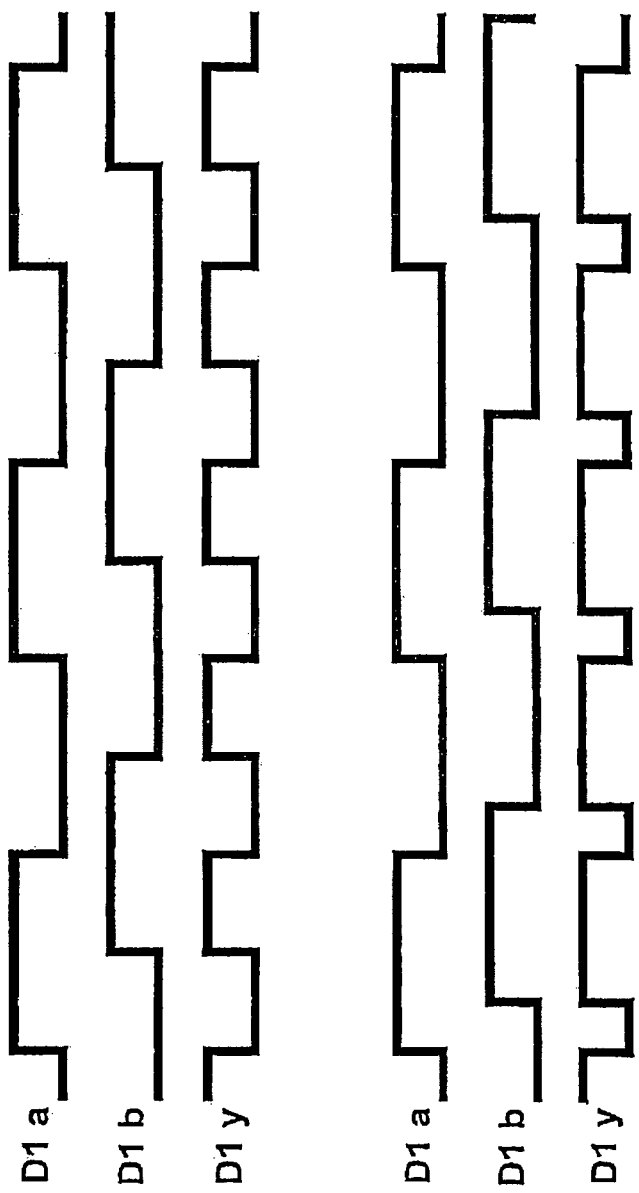
FIG. 2 (FIGS. 2A, 2B) shows schematically signal waveforms when the circuit to be programmed is open and when the circuit to be programmed is closed, in which a certain impedance exists.

If the switch S is closed, the phase difference is reduced and the duty factor (i.e., mark-space ratio) at the output y of the EXOR gate D1 increases. FIG. 2B shows by way of example a phase difference of 45°, which is equivalent to a duty factor of 75%. The carrier frequency $f_T$ is doubled even at the smaller phase difference.

Figure 3:
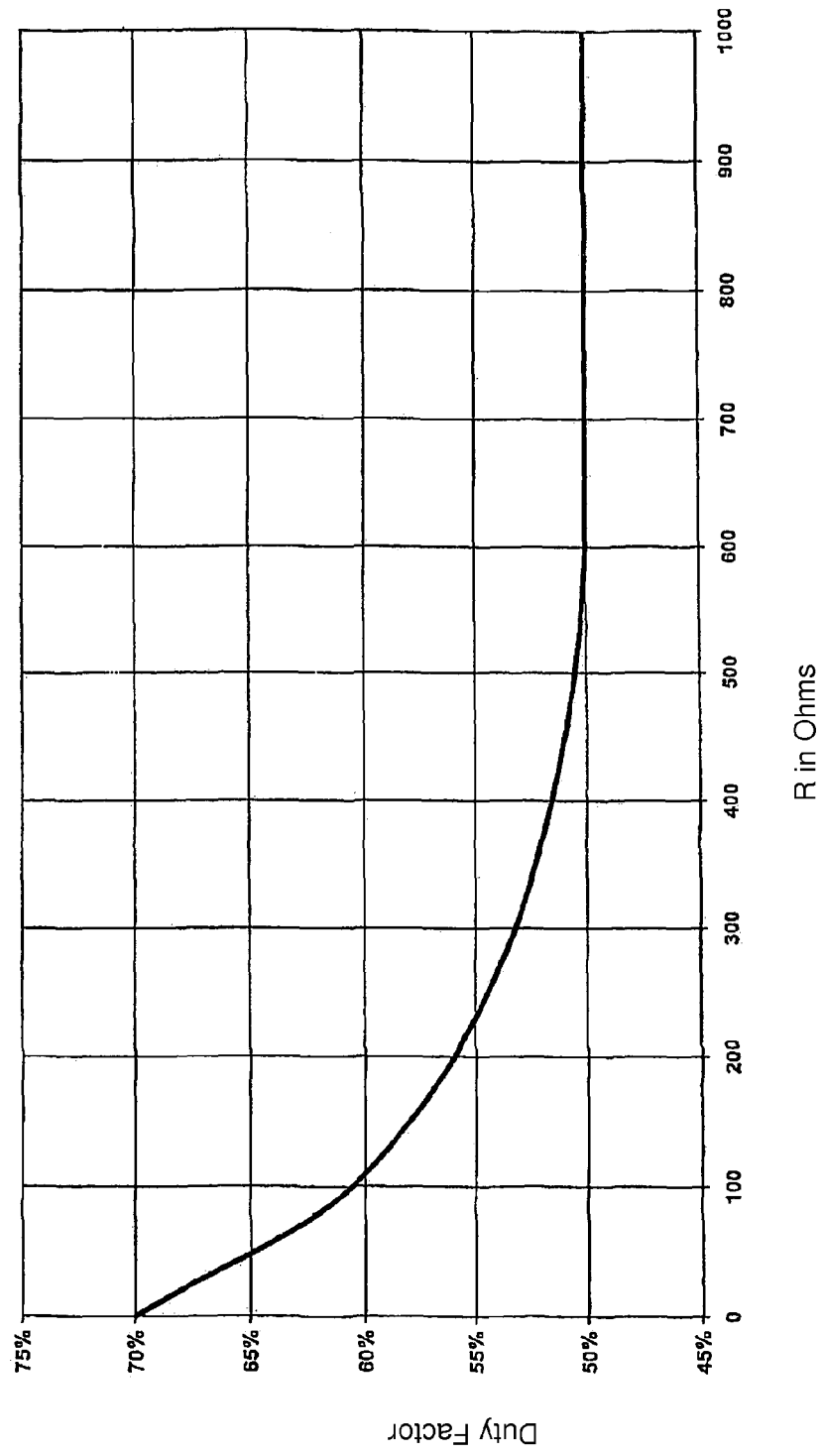
FIG. 3 shows schematically the variation of the duty factor (mark-space ratio) as a function of the impedance (in Ohms) that exists in the circuit to be programmed.

FIG. 3 shows a curve representing the possible variation of the duty factor as a function of the impedance R (in Ohms).

The additional elements described below of the circuit according to the invention are used to measure the duty factor that exists at the output y of the EXOR gate D1. To do this, the output y of the EXOR gate D1 is connected to an input e for changing the counting direction of a binary up/down counter D2 having a parallel output g of width n bits, for example 8 bits. The counting clock $f_Z$, as already described above, is supplied by the generator G, which is applied to the input f of the up/down counter D2.

Figure 4:
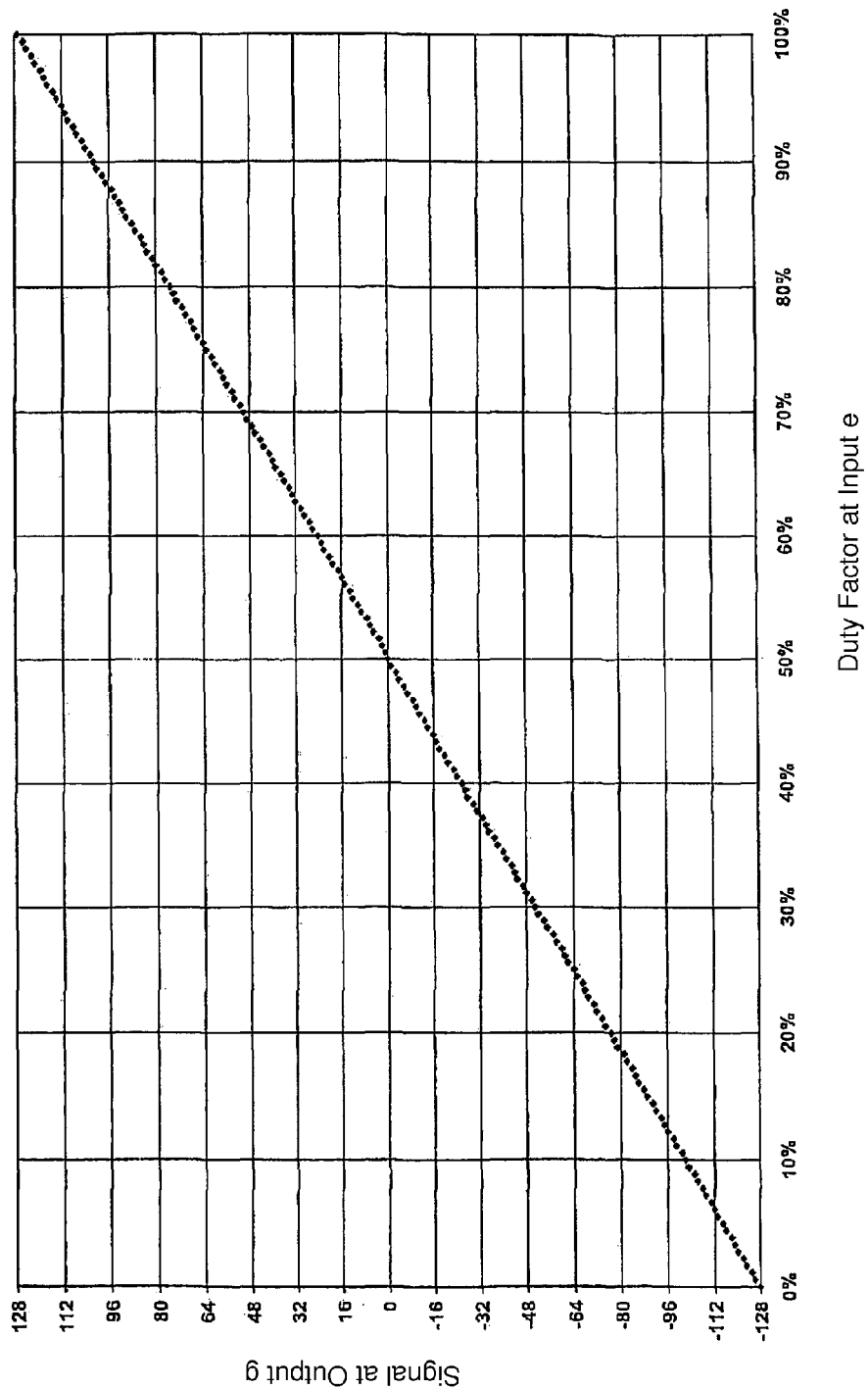
FIG. 4 shows schematically the variation of the output value of the up/down counter in the electronic circuit according to the invention shown in FIG. 1 as a function of the duty factor.

The up/down counter D2 counts from one reset until the next reset always exactly for one period of the carrier pulse rate $f_T$. The selection of the divider factor $2^{n-1}$ for the frequency divider D6 means that for the duty factor (mark-space ratio) of 100%, the counter counts only upwards to the counter reading $2^{n-1}-1$. For the duty factor of 0%, it counts only downwards to the counter reading $-2^{n-1}$. For the duty factor of 50%, the counter output is 0, because the counter counts exactly as many clock pulses upwards as downwards after the reset. As regards the reference phase difference of 90°, i.e. a duty factor of 50%, this assignment results in a constant and linear assignment of counter readings, which are ideally suited to the subsequent analysis in a microprocessor D4, because the count is provided in two's complement form. FIG. 4 shows this assignment of counter readings at the output g of the up/down counter D2 as a function of the mark-space ratio for an n=8 bit up/down counter D2.

Figure 5:
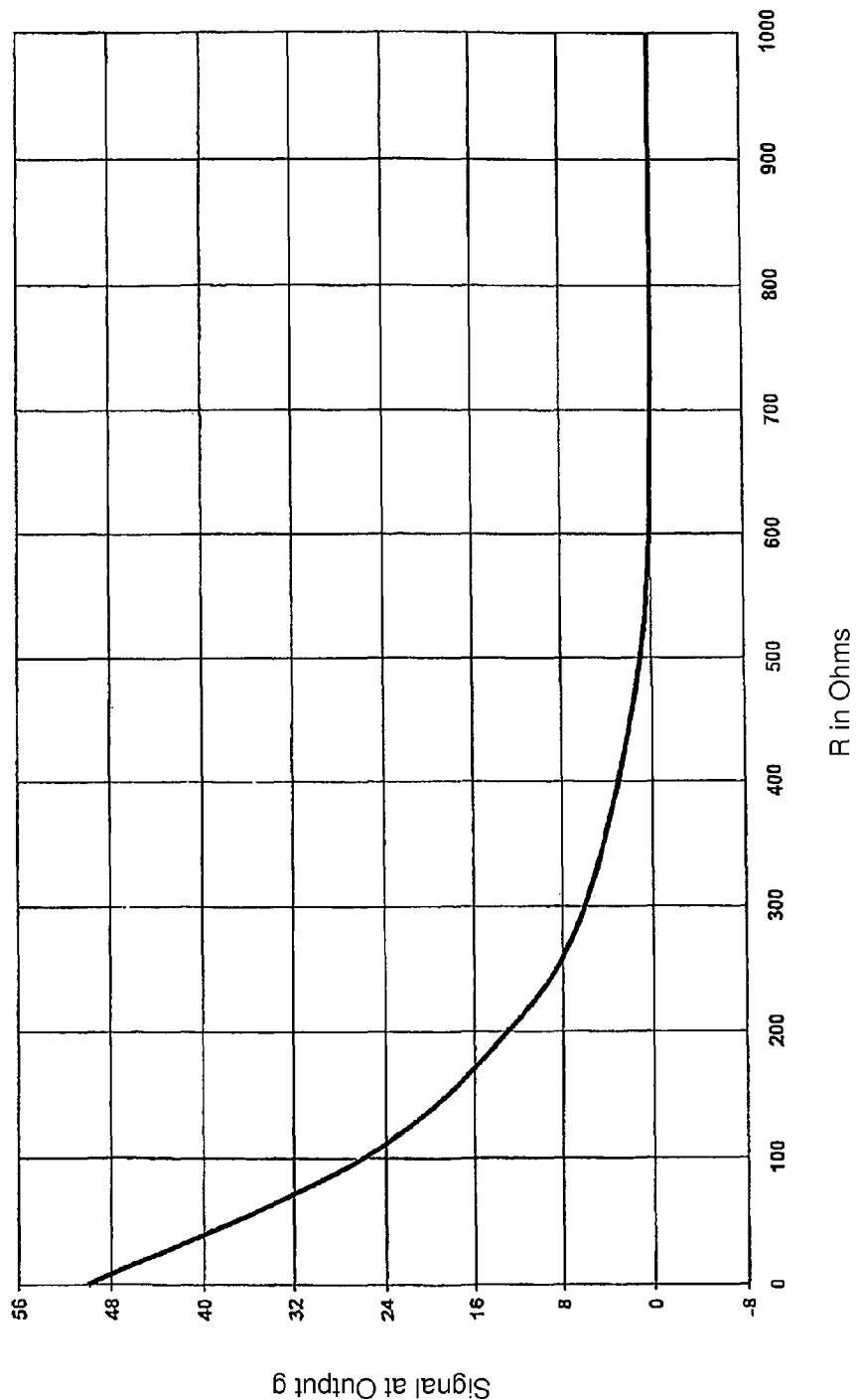
FIG. 5 shows schematically the variation of the output value of the up/down counter of the electronic circuit according to the invention shown in FIG. 1 as a function of the impedance (in Ohms) of the circuit to be programmed.

This and the information from FIG. 3 results in the mapping (for n=8) shown in FIG. 5 of the actual impedance R of the circuit to be programmed onto the counter readings at the output g of the up/down counter D2, in other words the variation of the counter reading plotted on the y-axis as a function of the impedance R (in Ohms) plotted on the x-axis.

The new counter value thereby formed in each clock period of the carrier frequency $f_T$ at the output g of the up/down counter D2 is initially buffered in the latch D3 for subsequent processing, and is available at the output k for retrieval by the microprocessor D4 throughout the entire carrier frequency clock period. For this purpose, the input i of the latch D3 is connected to the output g of the up/down counter D2. The validity of the input values is signaled to the microprocessor via the output signal of a delay element D5. This signal is applied to the input p of the microprocessor D4. This output signal from the delay element D5 also resets the up/down counter in order to initialize thereby the counting in a subsequent clock period. For this purpose, the output of the delay element D5 is also applied to the reset input d of the up/down counter D2. The input of the delay element D5 is connected to the control voltage and to the input a of the EXOR gate.

Using this simple electronic circuit according to the invention, by means of the microprocessor it is also possible, in addition to measuring the impedance, to additionally measure the cycle and number of phase differences, in order to decode the bit stream fed back by the electronics E and to generate a response A from the output r of the microprocessor D4. The electronic circuit according to the invention comprising the elements G, D1-D2, D5 and D6 therefore replaces a complex, analog band-pass circuit, which was used in the past to generate an analysis signal suitable for the microprocessor, and of course furthermore provides the advantage described above of the facility to analyze the size of the phase difference.

In addition to measuring the connection impedance R in a measurement environment that is defined with regard to the coupling factor k, when this circuit is in use it is also possible to warn the user when there is weak inductive coupling of the electronics E to be programmed, in order, for example, to achieve a better position between the transmitter coil Ls and receiver coil Le.

The following is a list of reference symbols used in the description and the drawing:
C capacitor
D1 EXOR gate
D2 up/down counter
D3 latch
D4 microprocessor
D5 delay element
D6 frequency divider
E microprocessor
$f_R$ feedback frequency
$f_T$ carrier frequency
$f_Z$ counting frequency
G frequency generator
k coupling factor
Ls transmitter coil
Le receiver coil
P level converter
R impedance
S semiconductor switch
V power stage
a, b inputs of EXOR gate D1
y output of EXOR gate D1
d, e, f inputs of up/down counter D2
g output of up/down counter D2
h, I inputs of latch D3
k output of latch D3
P, q inputs of microprocessor D4
r output of microprocessor

The invention claimed is:

1. An electronic circuit in an external programming device and configured for contactless programming of a circuit to be programmed, the electronic circuit comprising:
   a series resonant circuit including a transmitter coil and a capacitor connected in series;
   said transmitter coil of the series resonant circuit being disposed for inductive coupling to a receiver coil of the circuit to be programmed; and
   a device connected to said series resonant circuit and configured for determining, from a phase difference between a control voltage of said series resonant circuit and a capacitor voltage of said series resonant circuit, an actual impedance existing in the circuit to be programmed.

2. The electronic circuit according to claim 1, wherein said device for determining the actual impedance comprises an equivalence element having a first input receiving a control voltage, pulsed at a carrier frequency, a second input receiving the capacitor voltage of said series resonant circuit, and an output, and said device for determining the actual impedance further comprises means for determining a duty factor at said output of said equivalence element.

3. The electronic circuit according to claim 2, wherein said equivalence element is an EXOR gate or an EXNOR gate.

4. The electronic circuit according to claim 2, wherein the capacitor voltage is fed to said second input of said equivalence element via a level converter.

5. The electronic circuit according to claim 2, which comprises a frequency generator and a frequency divider connected to said output of said frequency generator for generating the carrier frequency.

6. The electronic circuit according to claim 5, wherein said frequency divider has a divider factor of $2^{n-1}$.

7. The electronic circuit according to claim 2, wherein said means for determining the duty factor is a binary up/down counter, said up/down counter having an up/down input connected to said output of said equivalence element, and said up/down counter is clocked by a counting clock that equals a multiple of the carrier frequency.

8. The electronic circuit according to claim 7, wherein the counting clock equals $2^{n-1}$ times the carrier frequency and has an n-bit wide output.

9. The electronic circuit according to claim 7, wherein an output of said up/down counter is connected to an input of a latch, and said latch has a further input connected to said first input of said equivalence element and configured to trigger a data transfer.

10. The electronic circuit according to claim 9, which further comprises a delay element connected between said first input of said equivalence element and a reset input of said up/down counter, and wherein said delay element is operated at the carrier frequency.

11. The electronic circuit according to claim 9, wherein said latch has an output connected to a microprocessor.

12. The electronic circuit according to either of claim 11, which further comprises a delay element connected between said first input of said equivalence element and a reset input of said up/down counter, and wherein said delay element is operated at the carrier frequency, and said delay element has an output connected to an input of the microprocessor, said input determining a validity of data at the input port.

13. A method of determining an impedance that actually exists in a programmable circuit, wherein the programmable circuit includes a receiver coil for contactless coupling with an electronic circuit containing a series resonant circuit and wherein the series resonant circuit includes a transmitter coil and a capacitor, the method which comprises:
   inductively coupling the transmitter coil of the series resonant circuit to the receiver coil of the programmable circuit;
   measuring a phase difference between a control voltage of the series resonant circuit and a capacitor voltage of the series resonant circuit; and
   determining from the phase difference, the impedance that actually exists in the programmable circuit.

14. The method according to claim 13, which comprises determining the phase difference by logically combining the control voltage, pulsed at a carrier frequency, and the capacitor voltage of the series resonant circuit with an equivalence element, and analyzing a duty factor of a signal at an output of the equivalence element.

15. The method according to claim 14, wherein the equivalence element is an EXOR gate or an EXNOR gate.

16. The method according to claim 13, which comprises generating the carrier frequency with a frequency generator and a frequency divider connected to an output of the frequency generator.

17. The method according to claim 16, wherein the frequency divider has a divider factor of $2^{n-1}$.

18. The method according to claim 13, which comprises determining the duty factor of the signal at the output of the equivalence element by way of an up/down counter, inputting the signal at the output of the equivalence element to an up/down input of the up/down counter, and clocking the up/down counter by a counting clock that equals a multiple of the carrier frequency.

19. The method according to claim 18, wherein the up/down counter is a binary counter.

20. The method according to claim 18, which comprises clocking the up/down counter at $2^{n-1}$ times the carrier frequency and providing the up/down counter with an n-bit wide output.

* * * * *